United States Patent
Wang et al.

(10) Patent No.: US 9,131,626 B2
(45) Date of Patent: Sep. 8, 2015

(54) ELECTRONIC DEVICE INCLUDING A JET FLOW GENERATOR

(71) Applicants: Inventec (Pudong) Technology Corporation, Shanghai (CN); INVENTEC CORPORATION, Taipei (TW)

(72) Inventors: Feng-Ku Wang, Taipei (TW); Yi-Lun Cheng, Taipei (TW); Chih-Kai Yang, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 305 days.

(21) Appl. No.: 13/714,715

(22) Filed: Dec. 14, 2012

(65) Prior Publication Data

US 2013/0240182 A1   Sep. 19, 2013

(30) Foreign Application Priority Data

Mar. 16, 2012   (TW) .............................. 101109177 A

(51) Int. Cl.
*H05K 7/20* (2006.01)
*G06F 1/20* (2006.01)

(52) U.S. Cl.
CPC ............ *H05K 7/20136* (2013.01); *G06F 1/203* (2013.01)

(58) Field of Classification Search
CPC ....... H05K 7/20136–7/20154; H05K 7/20336; G06F 1/203
USPC ....................... 361/679.46–679.54, 688–723; 165/80.1–80.5, 104.33, 185; 257/712–722, E23.088; 174/15.1–15.2, 174/16.1–16.3, 548
See application file for complete search history.

(56) References Cited

U.S. PATENT DOCUMENTS

| | | | | |
|---|---|---|---|---|
| 6,937,472 | B2 * | 8/2005 | Pokhama ....................... | 361/700 |
| 8,033,324 | B2 * | 10/2011 | Mukasa et al. ............... | 165/80.3 |
| 2002/0159232 | A1 * | 10/2002 | Beitelmal et al. ............. | 361/695 |
| 2004/0123978 | A1 * | 7/2004 | Hashimoto et al. .......... | 165/80.3 |
| 2006/0181851 | A1 * | 8/2006 | Frank et al. ................... | 361/700 |
| 2009/0219686 | A1 * | 9/2009 | Ishikawa et al. .............. | 361/692 |
| 2009/0237882 | A1 * | 9/2009 | Lin et al. ....................... | 361/697 |
| 2012/0069520 | A1 * | 3/2012 | Kaneko et al. ................ | 361/692 |

* cited by examiner

*Primary Examiner* — Zachary M Pape
(74) *Attorney, Agent, or Firm* — Locke Lord LLP; Tim Tingkang Xia, Esq.

(57) ABSTRACT

An electronic device comprises a casing, a heat generation source, an airflow guiding structure, and a jet flow generator. The casing includes an interior space. The airflow guiding structure is in contact with the heat generation source and has one air inlet. The jet flow generator, the heat generation source, and the airflow guiding structure together are situated within the interior space. The jet flow generator includes a nozzle which directs toward the air inlet of the airflow guiding structure at a distance apart. Airflows emitted by the jet flow generator through the nozzle travel at a velocity greater than 0.1 meters/second (m/s), causing a fluid pressure differential with the neighboring air and pulling air in the vicinity along the air inlet into the airflow guiding structure.

14 Claims, 13 Drawing Sheets

ELECTRONIC DEVICE INCLUDING A JET FLOW GENERATOR

CROSS-REFERENCE TO RELATED APPLICATIONS

This non-provisional application claims priority under 35 U.S.C. §119(a) on Patent Application No(s). 101109177 filed in Taiwan, R.O.C. on Mar. 16, 2012, the entire contents of which are hereby incorporated by reference.

BACKGROUND

1. Technical Field

The invention relates to an electronic device and, more specifically, an electronic device with jet flow generators.

2. Background

In recent years, one or more axial fans or centrifugal fans have been installed inside electronic devices to remove the heat generated by electrical components. Heat-dissipating fans introduce external cool air into the electronic device. As air flows in, heat exchange takes place between the incoming air and the warmer air near the electrical components of the electronic device, and the heated air is then discharged to outside environment through the openings formed on the electronic device.

Recent technical advances in the computational power and speed of electronic have empowered users to perform highly intensive computations. The increase in the complexity of these computations on faster components results in the elevation in the levels of heat generated by the components. Conventional approaches to heat dissipation for the electronic devices based on axial fans or centrifugal fans are now barely capable of keeping up with the increased demand for heat management in electronic devices. The lack of sufficient cooling results in higher temperatures near the electrical components, and can not only cause operational errors, but may contribute to component failure.

As a result, increasing the effectiveness of heat dissipation for electronic devices remains a major challenge for researchers and engineers.

SUMMARY

The electronic device of the present invention includes a casing with an interior space, a heat generation source, an airflow guiding structure which is in contact with the heat generation source, and a jet flow generator. The jet flow generator, the heat generation source and the airflow guiding structure, in which one air inlet is included, reside within the interior space. The jet flow generator has a first nozzle which directs toward the air inlet of the airflow guiding structure at a distance apart. The jet flow generator is configured to emit first air jet flow from through the first nozzle travels at a velocity greater than 0.1 meters/second (m/s), causing a fluid pressure differential with neighboring of the air jet flow and pulling air in its vicinity along the air inlet into the airflow guiding structure.

The electronic device of the present invention includes a casing with an interior space, a heat generation source, an airflow guiding structure which is in contact with the heat generation source, and a jet flow generator. The jet flow generator, the heat generation source and the airflow guiding structure, in which one air inlet, one air outlet and a plurality of cooling fins is included, reside within the interior space. The airflow guiding structure further includes an edge surface located at the air inlet of the airflow guiding structure and facing towards the first nozzle of the jet flow generator. The jet flow generator has a first nozzle which points to the air inlet of the airflow guiding structure and is at a distance apart from the edge surface of the airflow guiding structure. The cross section of the air inlet in the airflow guiding structure is greater than or equal to that of the first nozzle of the jet flow generator. The jet flow generator is configured to emit a first air jet flow from the jet flow generator through the first nozzle at a velocity greater than 0.1 meters/second (m/s), causing a fluid pressure differential with neighboring air of the air jet flow and pulling air in its vicinity along the air inlet into the airflow guiding structure.

The electronic device of the present invention includes a casing with an interior space, a heat generation source, an airflow guiding structure which is in contact with the heat generation source, and a jet flow generator. The jet flow generator, the heat generation source and the airflow guiding structure, in which one air inlet, one air outlet and a plurality of cooling fins are included, reside within the interior space. The cooling fins stretch from the air inlet toward the air outlet. The airflow guiding structure includes an edge surface of concave shape located at the air inlet of the airflow guiding structure facing toward the first nozzle of the jet flow generator. The jet flow generator includes a first nozzle which points to the air inlet of the airflow guiding structure and is at a distance apart from the edge surface. The first nozzle of the jet flow generator has a first side, which faces the air inlet of the airflow guiding structure, and a second side opposite to the first side. The periphery of the edge surface of concave shape extends from the first side to the second side.

According the embodiments of the electronic device described above, the air jet flow emitted from the jet flow generator travels at a velocity greater than 0.1 meters/second (m/s), causing a fluid pressure differential with its neighboring air and pulling air in its vicinity along the air inlet into the airflow guiding structure, thus increasing heat dissipation efficiency for the electronic device.

The features, implementation and advantages of the invention included are presented in the context of the state of the art, accompanied by drawings in which the structure of the invention is shown by examples.

The following descriptions are exemplary embodiments only, and are not intended to limit the scope, applicability or configuration of the invention in any way. Rather, the following descriptions provide convenient illustrative examples for implementing the invention. Various changes to the described embodiments may be made in the functionality and arrangement of the elements described without departing from the scope of the invention as set forth in the claims herein.

DRAWINGS

The present disclosure can be better understood from the detailed description given below for illustration only and thus does not limit the present disclosure, wherein:

FIG. 1 is a three dimensional composite layout of the first embodiment of an electronic device of the present invention;

FIG. 2 presents a decomposition layout of the embodiment described in FIG. 1;

DETAILED DESCRIPTION

Figure 1:
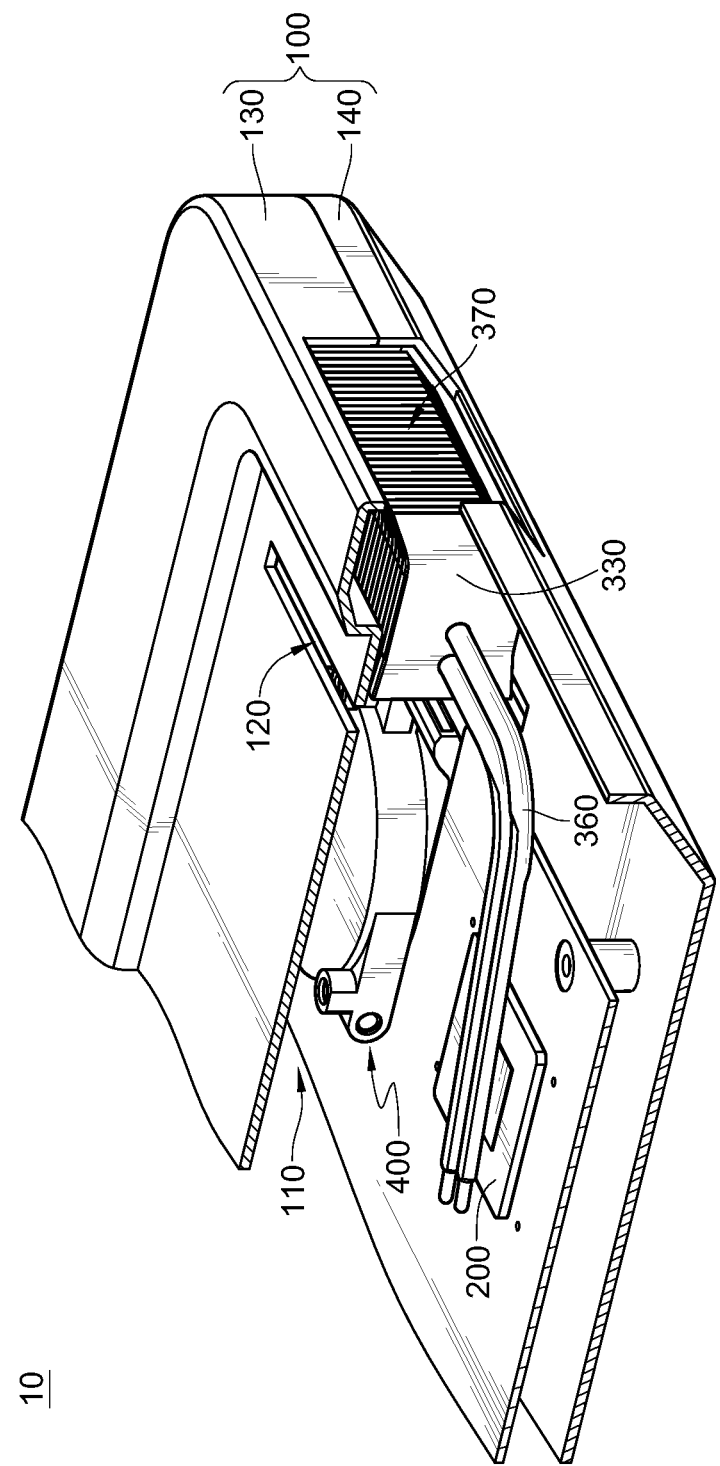
Figure 2:
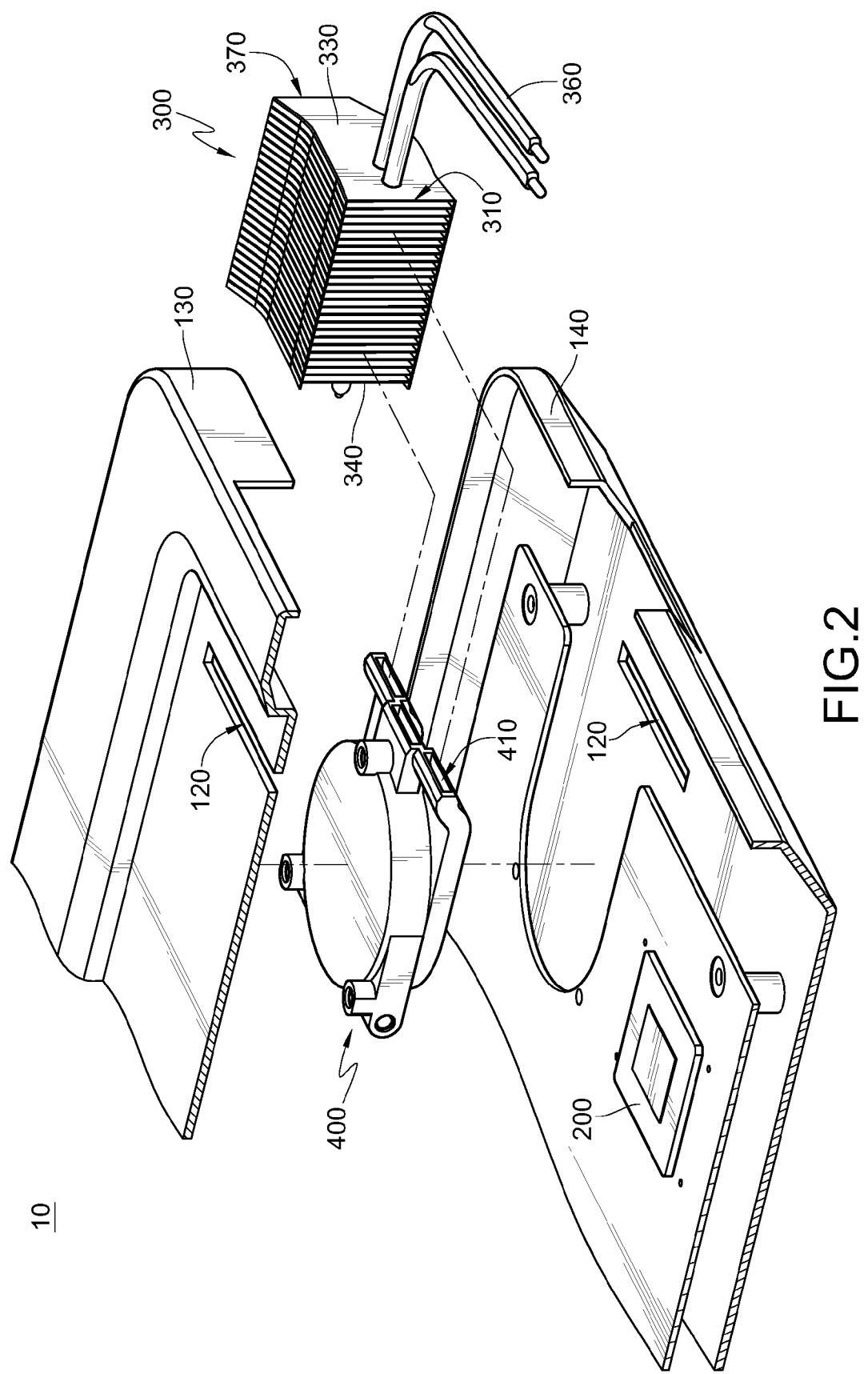
Figure 3:
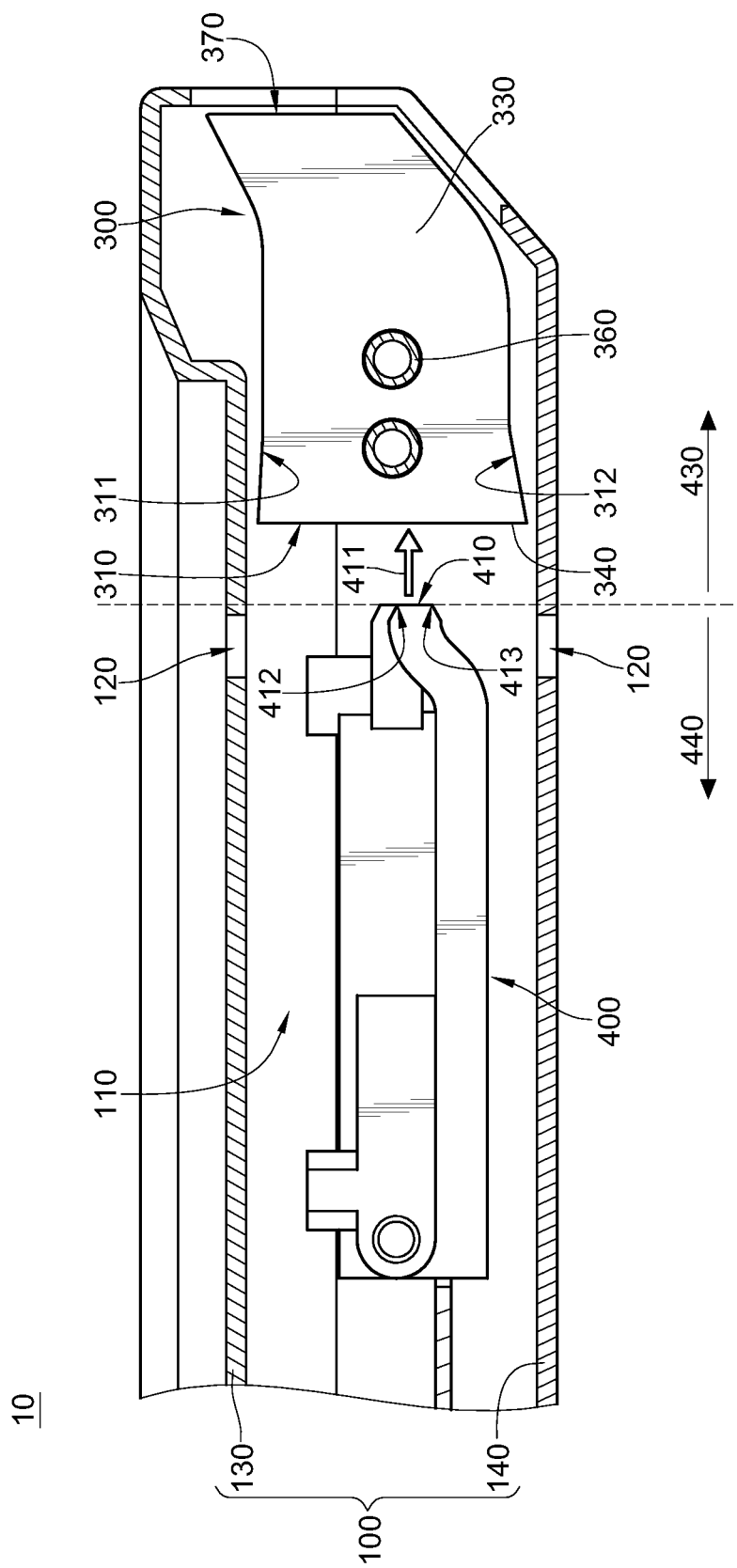
FIG. 3 is a sectional view of the embodiment described in FIG. 1.

With reference to FIGS. 1 to 3, FIG. 1 is a three dimensional composite layout of the first embodiment of an electronic device of the present invention; FIG. 2 presents a decomposition layout of the embodiment described in FIG. 1; FIG. 3 is a sectional view of the embodiment described in FIG. 1. A notebook computer is used as the electronic device 10 for demonstration throughout, but the scope of the invention is not limited to the notebook computer example.

The first embodiment of an electronic device 10 includes a casing 100 with an interior space 110, a heat generation source 200, an airflow guiding structure 300 with which the heat generation source is in contact, and a jet flow generator 400. The heat generation source 200, the airflow guiding structure 300 and the jet flow generator 400 reside within the interior space 110. As an example, a central processing unit (CPU) is regarded as the heat generation source of the electronic device 10.

Heat released from the heat generation source 200 is absorbed by and transferred to the airflow guiding structure 300 through, but not limited to, contact with heat pipes 360. The airflow guiding structure includes one air inlet 310 and a plurality of cooling fins 330. The jet flow generator 400 has a first nozzle 410 which directs toward the air inlet 310 of the airflow guiding structure at a distance apart. The cooling fins 330 stretch from the air inlet 310 in the direction away from the first nozzle 410 of the jet flow generator. A first air jet flow 411 emitted by the jet flow generator 400 through the first nozzle 410 travels at a velocity greater than 0.1 m/s, causing a fluid pressure differential with its neighboring air and pulling air in its vicinity along the air inlet 310 into the airflow guiding structure 300.

In addition, there is an edge surface 340 facing the first nozzle 410 of the jet flow generator. The edge surface 340 in the first embodiment is a flat surface.

The principle for the operation of the jet flow generator 400 of the present invention may be based as an axial fan or a centrifugal fan to generate airflow along the axis of the fan using rotating blades, or membrane vibrations to produce an air jet stream ejected from the jet flow generator 400 at a velocity of 3 to 10 m/s or faster. According to Bernoulli's principle, the faster a fluid moves the less pressure it exerts. Therefore, the faster the first air jet flow 411 discharged from the jet flow generator 400 of the embodiment moves, the less pressure it bears, pulling air in its vicinity along the air inlet 310 into the airflow guiding structure 300, thus cooling down the airflow guiding structure 300 at a faster rate.

In this embodiment and other embodiments of the present invention, a casing 100 has an air inlet structure 120 that facilitates the movement of the airflow between the interior space 110 and the outside of the casing 100. The velocity of the first air jet flow 411 is greater than that of its neighboring airflow passing through the air inlet structure 120 and entering the air inlet 310.

In this embodiment, the air inlet structure 120 is a through hole. Details of this embodiment can be described as follows: the casing 100 comprises one first panel 130 and one second panel 140, with a airflow guiding structure 300 and a jet flow generator 400 situated between these two panels. In other words, the first panel 130 and the second panel 140 stretch from the jet flow generator 400 to the airflow guiding structure 300. There are two through holes, one on the first panel 130 and the other on the second panel 140, leading to the interior space 110 allowing air to be drawn in from outside the casing 100.

Heretofore, a notebook computer depends on the cooling fan inside to generate airflow and to draw neighboring air through the cooling fan itself along the cooling fins. It is known that air inside the notebook computer has already been through heat exchange with the heated electrical components inside and has reached a higher temperature than that of air outside prior to being pulled to the cooling fan. The embodiments of the present invention illustrate that the first air jet flow 411 ejected from the jet flow generator 400 will not only draw its neighboring air inside the casing 100 along but also brings in cool air via the through holes on the casing 100 from outside the casing 100 into the airflow guiding structure 300 to facilitate the heat exchange process. Furthermore, air prior to being drawn into the casing 100 from outside originally is at a lower temperature due to the lack of contact with the heat generation source 200. Thus, in comparison to previously developed conventional heat dissipation systems, the implementation of using a first air jet flow 411 to draw in cool air via the through holes on the casing 100 from outside the casing 100 into the airflow guiding structure 300 for heat exchange process increases the heat dissipation effectiveness and efficiency of the electronic device 10.

Figure 4A:
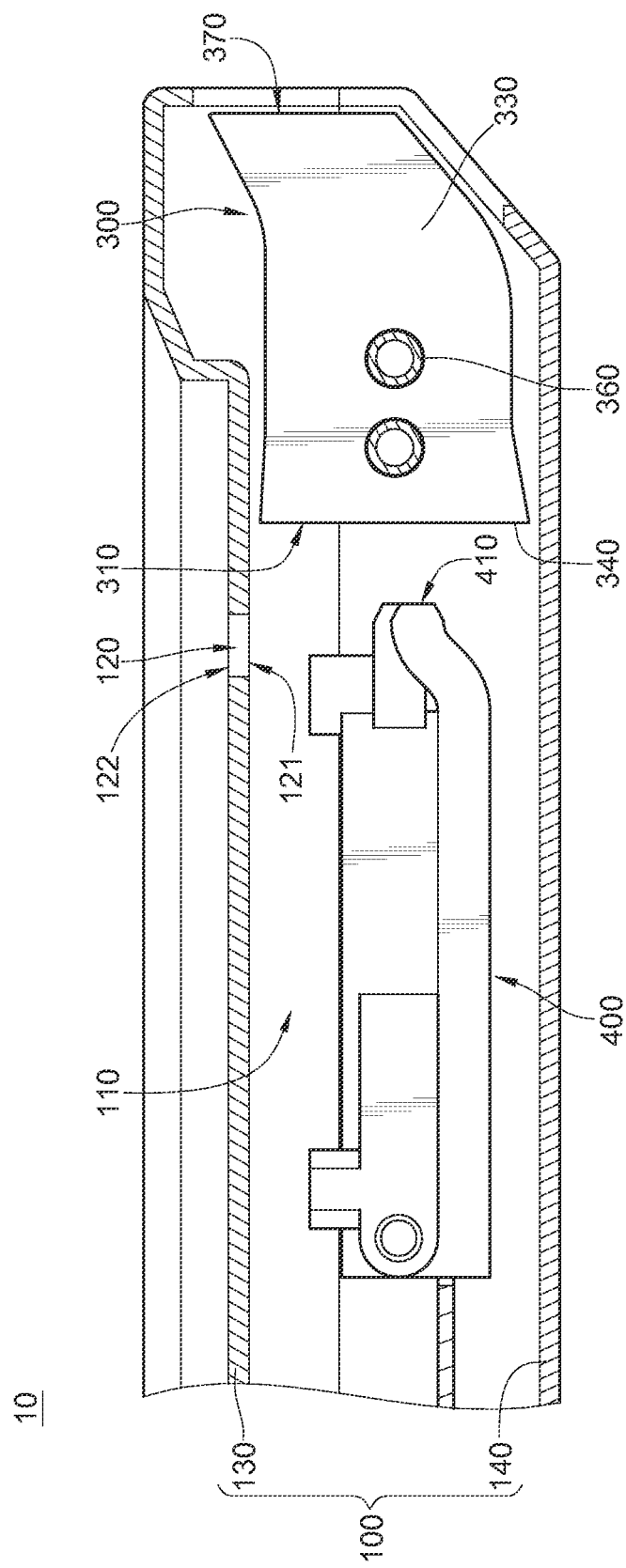
FIG. 4A is a sectional view of the second embodiment of an electronic device of the present invention.

In addition, the number of through holes in the embodiments shall be viewed for illustration only and shall not limit the design of the present invention as shown in FIG. 4A. FIG. 4A is a sectional view of the second embodiment of an electronic device of the present invention. In the embodiment presented in FIG. 4A the number of through hole can be one while in other embodiments, through holes are not limited to be on the first panel 130, as illustrated in FIG. 4A, and can be on the second panel 140 as well.

In this embodiment and other embodiments of the present invention, a through hole comprises one first edge 121, which is close to the jet flow generator 400, and one second edge 122 at a further distance from the jet flow generator 400. One first distance of the first edge 121 of the through hole to the air inlet 310 of the airflow guiding structure is smaller than one second distance between the second edge 122 of the through hole and the air inlet 310 of the airflow guiding structure.

Figure 4B:
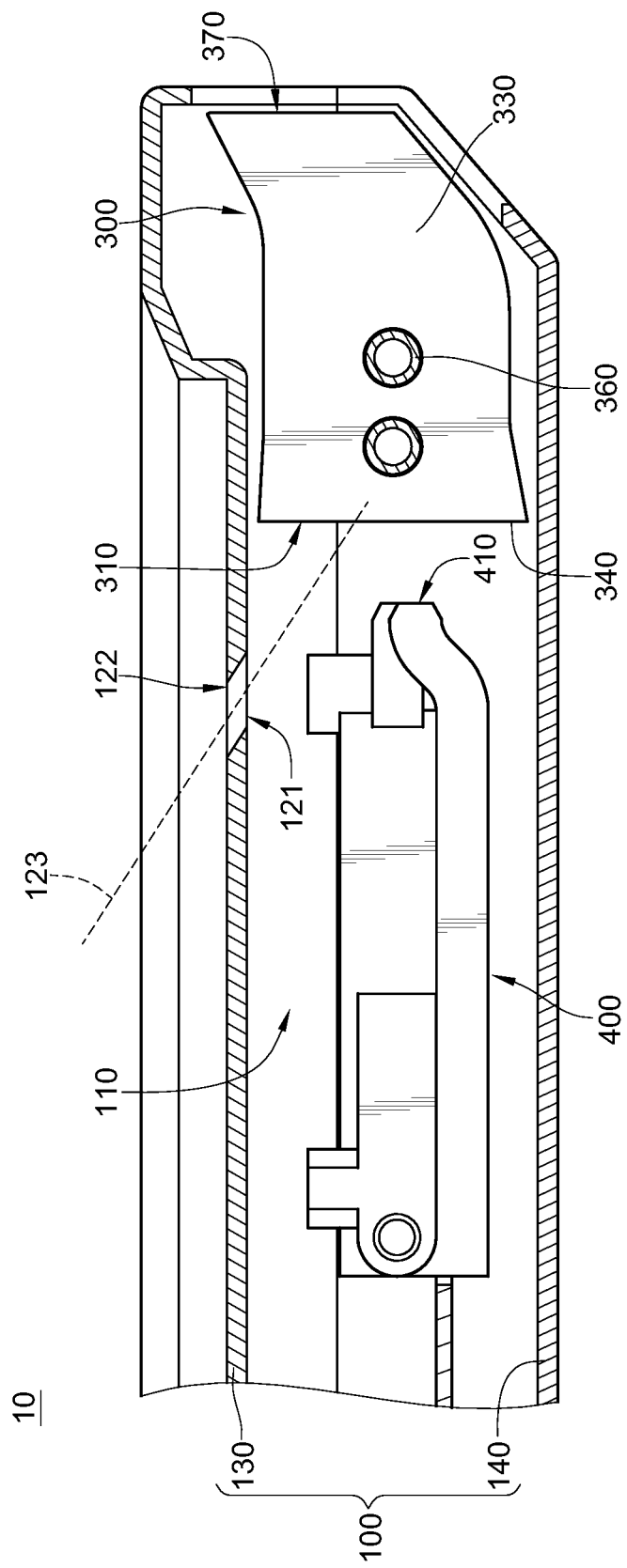
FIG. 4B is a sectional view of the third embodiment of an electronic device of the present invention.

FIG. 4B provides a sectional view of the third embodiment of an electronic device of the present invention. There is an axis 123 of the through hole passing from the first edge 121 through the second edge 122 and pointing toward the air inlet 310 of the airflow guiding structure in the embodiment, as displayed in FIG. 4B. In other words, the surface formed by the air inlet structure 120 in the casing 100 can be designed with an angle that positions the surface relatively parallel to the direction of airflow from outside the casing 100 into the interior space 110, in order to reduce flow impedance during the process. The surface of hole depth connecting the first edge 121 and the second edge 122 of the through hole described above can be, but is not limited to, a inclined surface or a curved surface in the preferred embodiments.

Figure 5:
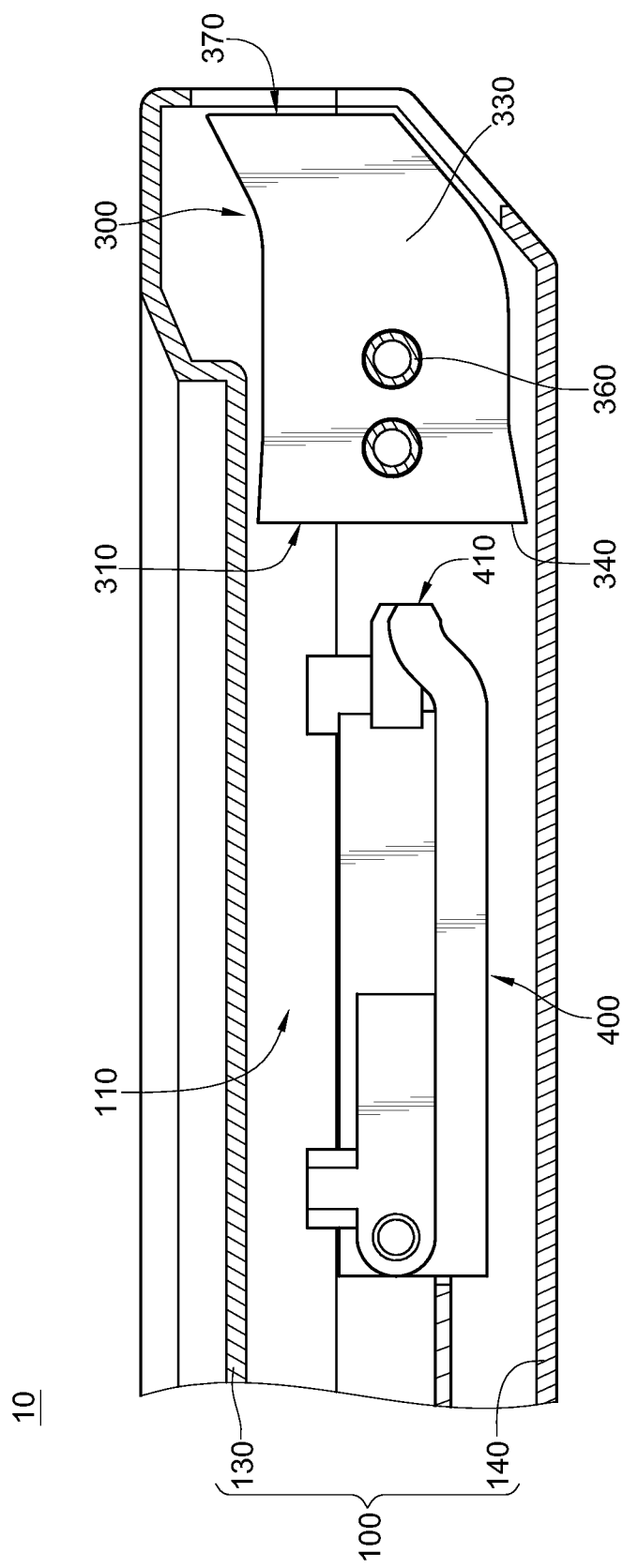
FIG. 5 is a sectional view of the fourth embodiment of an electronic device of the present invention.

FIG. 5 illustrates another embodiment as a sectional view of the fourth embodiment of an electronic device of the present invention. There is no through hole on either the first panel 130 or the second panel 140 in this embodiment and the small gap between the first panel 130 and the second panel 140 is regarded as the air inlet structure 120 allowing air surrounding the first air jet flow 411 to be drawn into the airflow guiding structure 300. The velocity of the air surrounding the first air jet flow 411 is slower than that of the first air jet flow 411.

More features of the fourth embodiment and other embodiments as illustrated in FIG. 3 include that the cross section of the air inlet 310 in the airflow guiding structure is greater to that of the first nozzle 410 of the jet flow generator. Further, the airflow guiding structure 300 comprises one first sidewall surface 311 and one second sidewall surface 312 together that form the air inlet 310. The air jet generator 400 has one third sidewall surface 412 and one fourth sidewall surface 413 which together form the first nozzle 410. The distance between the first sidewall surface 311 and the second sidewall surface 312 is greater than or equal to that of the third sidewall surface 412 to the fourth sidewall surface 413 in order to ensure that the first air jet flow 411 ejected from the first nozzle 410 of the jet flow generator will enter the airflow guiding structure 300.

Figure 6A:
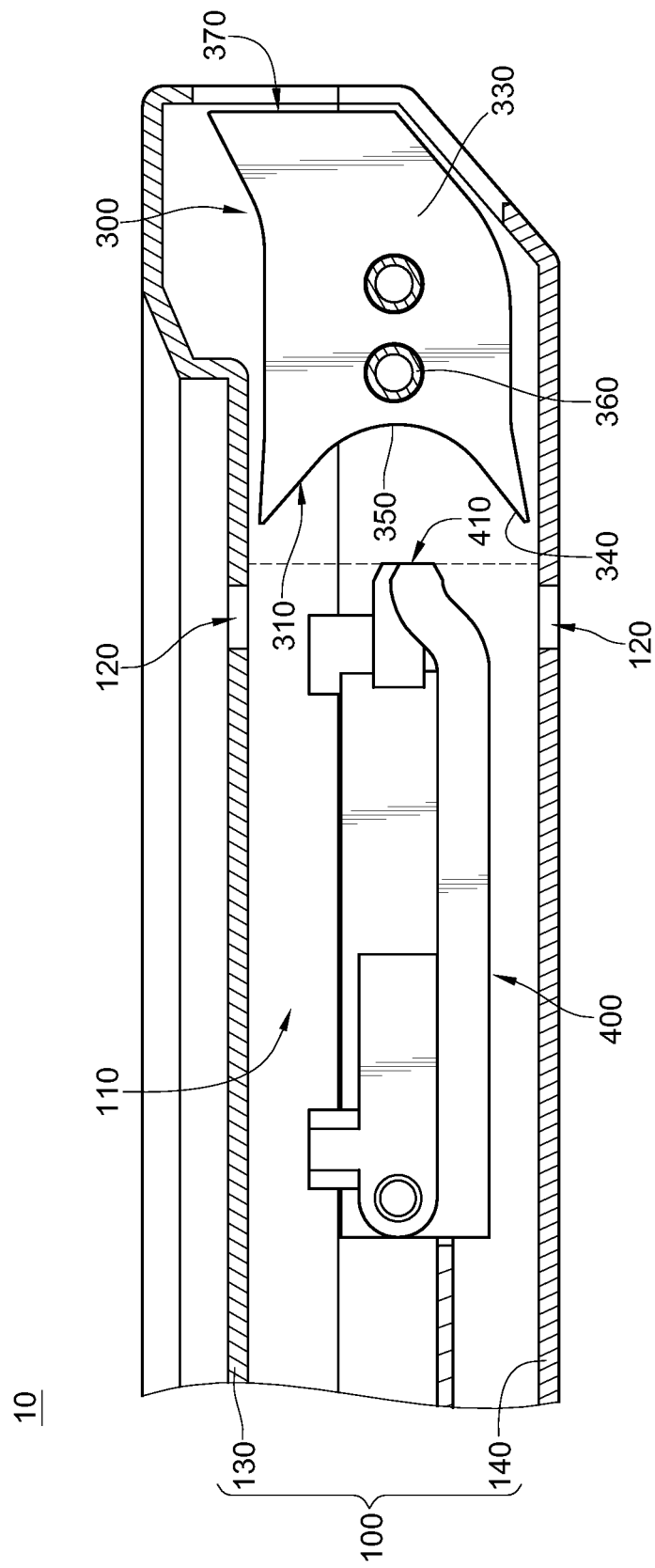
FIG. 6A is a sectional view of the fifth embodiment of an electronic device of the present invention.
Figure 6B:
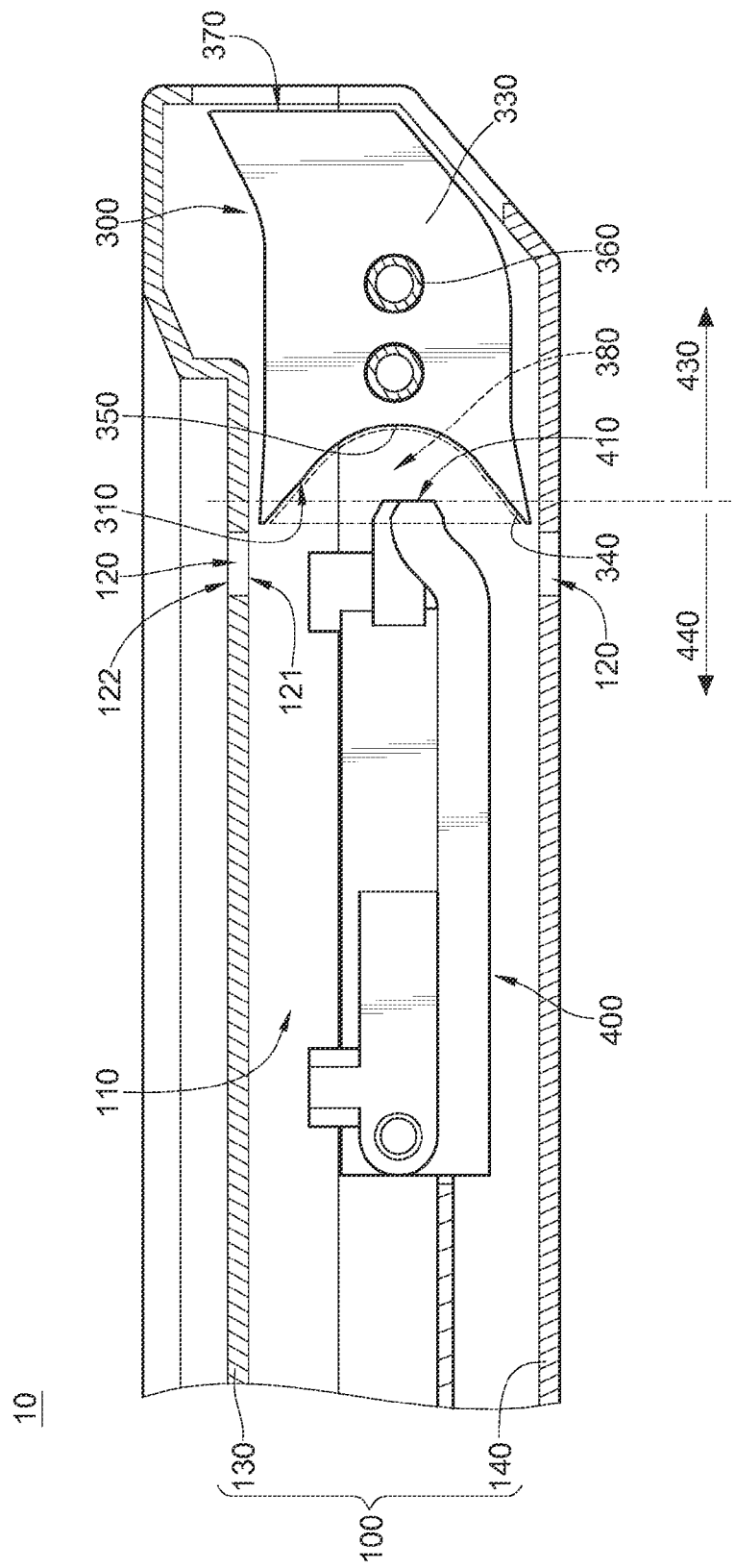
FIG. 6B is a sectional view of the sixth embodiment of an electronic device of the present invention.
Figure 6C:
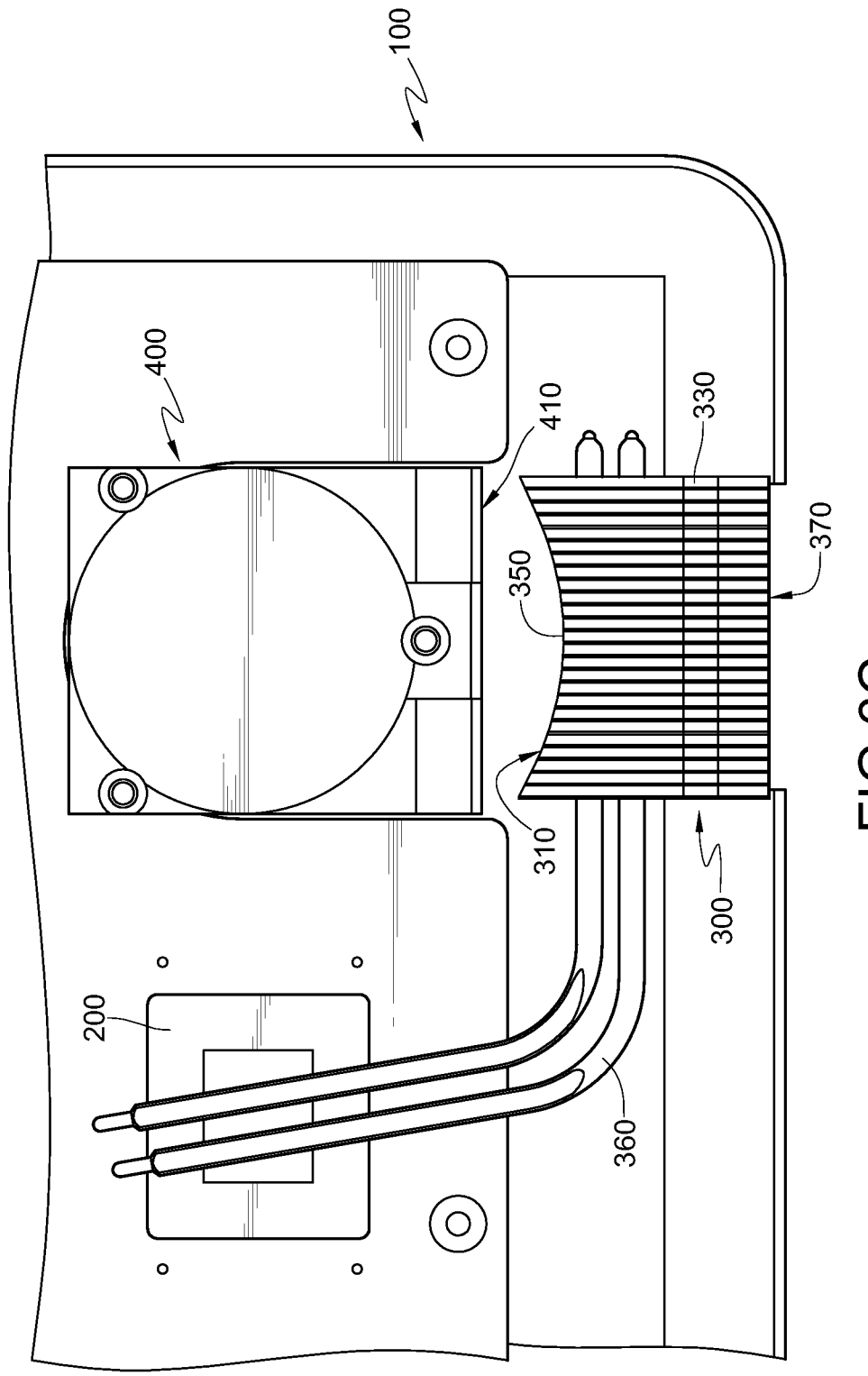
FIG. 6C is a sectional top view of the seventh embodiment of an electronic device of the present invention.

FIG. 6A is a sectional view of the fifth embodiment of an electronic device of the present invention; FIG. 6B is a sectional view of the sixth embodiment of an electronic device of the present invention; FIG. 6C is a sectional top view of the seventh embodiment of an electronic device of the present invention. With reference to the diagram in FIG. 6A, the airflow guiding structure 300 comprises an air inlet 310, an air outlet 370 and a plurality of cooling fins 330, which extend from the air inlet 310 toward the air outlet 370. The airflow guiding structure 300 also includes one edge surface 340 facing the first nozzle 410 at the location of the air inlet 310. The edge surface 340 described in the fifth embodiment is concave. In other words, the edge surface 340 has a cavity 350 opposite to the first nozzle 410. Further illustration presented in FIG. 6B, divided at the first nozzle 410 of the jet flow generator, there are one first side 430, which resides in the same area as the air inlet 310 of the airflow guiding structure is, and one second side 440 in the opposite direction. The edge surface 340 with a concave shape extends from the first side 430 to the second side 440 to form the cavity 350. Thus, the first nozzle 410 is located within the space of the cavity 350 of the airflow guiding structure 300. In other words, the air inlet space 380, which is enclosed by the edge surface 340 of concave shape and the periphery of the edge surface 340, contains the first nozzle 410.

Therefore, the upper and lower space in the first side 430, defined with respect to the first nozzle 410, is enclosed within the periphery of the edge surface 340 of the airflow guiding structure 300 in this embodiment. Thus, when the first air jet flow 411 is ejected from the first nozzle 410 of the jet flow generator in the direction of the first side 430, the neighboring air of the first air jet flow 411 in the upper and lower space will flow into the airflow guiding structure 300 along the edge surface 340.

Furthermore, the cavity 350 is not limited to a vertical cavity and can be a horizontal cavity or uses both vertical and horizontal cavities. The horizontal cavity 350 is shown in FIG. 6C. Thus, when the first air jet flow 411 is ejected from the first nozzle 410 of the jet flow generator in the direction of the first side 430, the neighboring air of the first air jet flow 411 from the left and right space will flow into the airflow guiding structure 300 along the edge surface 340. As described in the embodiments, a vertical cavity means that the cavity 350 extends its curve from the first panel 130 to the second panel 140 whereas a horizontal cavity is defined as that the cavity 350 extends its curve from one side of the cooling fins 330 to the opposite side of the cooling fins 330.

Figure 7:
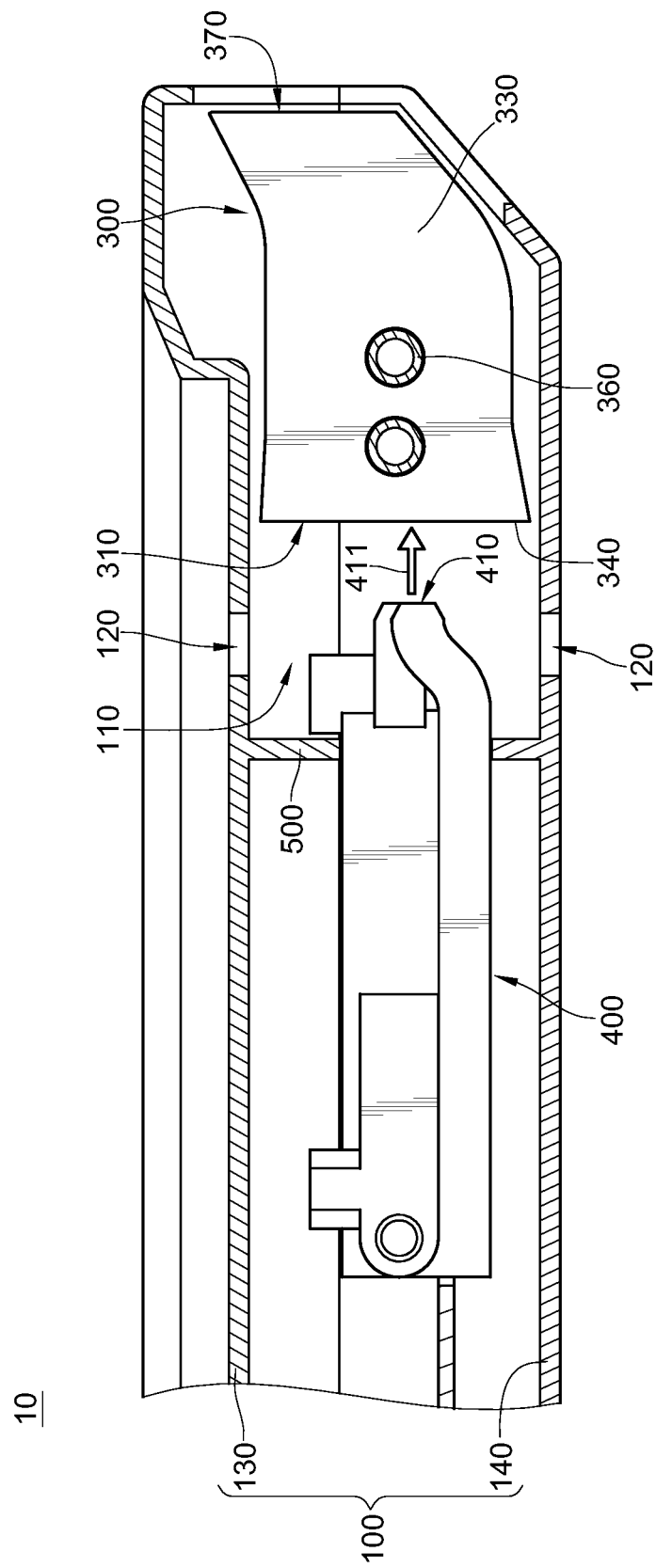
FIG. 7 is a sectional view of the eighth embodiment of an electronic device of the present invention.

The electronic device 10 described in the embodiment or other embodiments also includes an airflow blocking plate 500 as illustrated in FIG. 7. FIG. 7 is a sectional view of the eighth embodiment of an electronic device of the present invention. In this embodiment, the electronic device 10 includes two pieces of airflow blocking plate 500 separately located between the casing 100 and the jet flow generator 400 and, the air inlet structure 120 is located between the airflow blocking plate 500 and the first nozzle 410. In other words, one of the airflow blocking plates 500 located between the jet flow generator 400 and the first panel 130 and the other airflow blocking plate 500 placed between the jet flow generator 400 and the second panel 140 are to block the airflow. When the first air jet flow 411 is ejected from the first nozzle 410 of the jet flow generator, the airflow blocking plates 500 bar the airflow in one direction and force the first air jet flow 411 and its surrounding air to mass into the airflow guiding structure 300. Therefore, the addition of the airflow blocking plate 500 increases the airflow rate entering the air flow guiding structure 300 and, as a result, increases the heat dissipation efficiency for the electronic device 10.

Figure 8A:
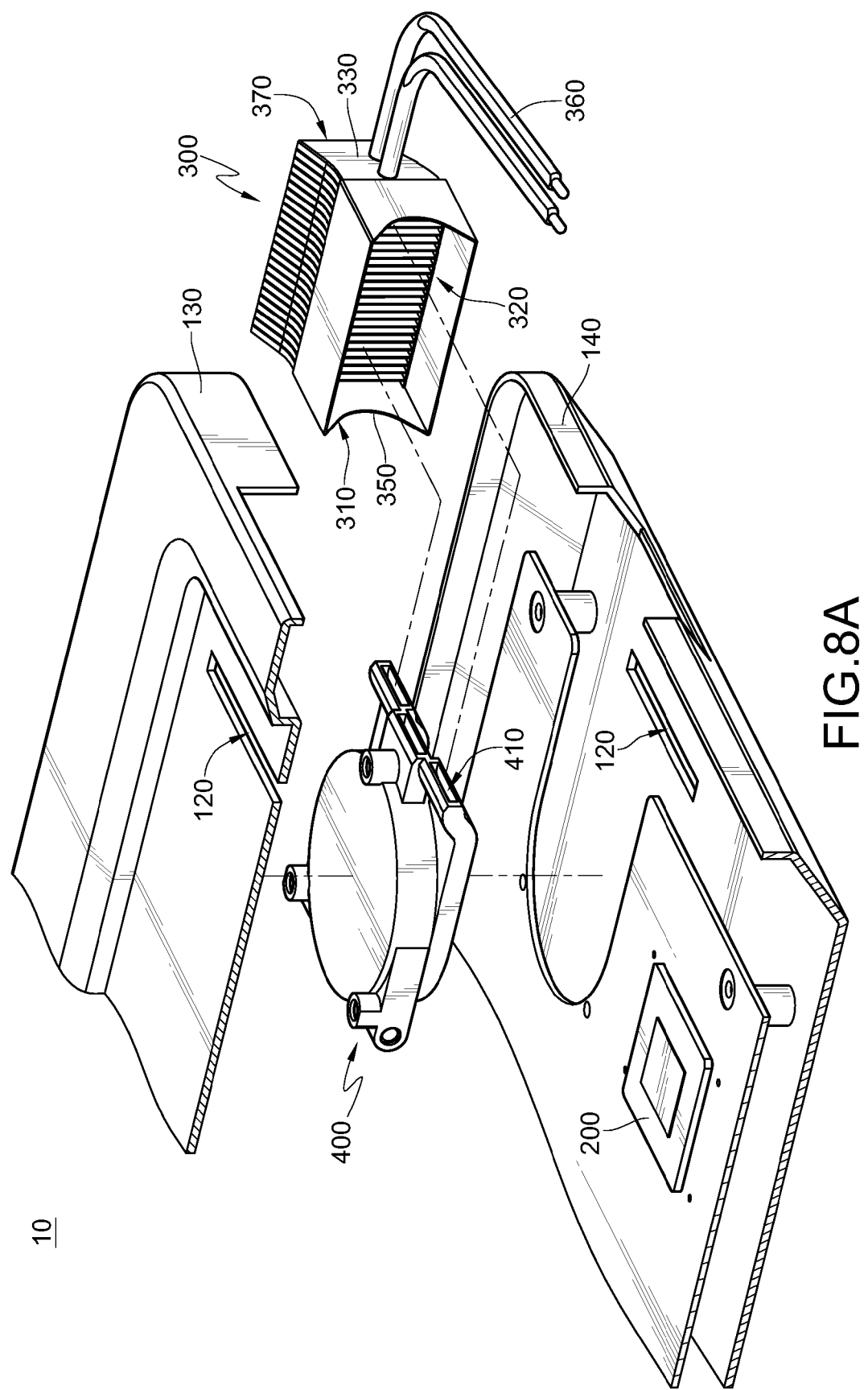
FIG. 8A is a three dimensional composite layout of the ninth embodiment of an electronic device of the present invention.
Figure 8B:
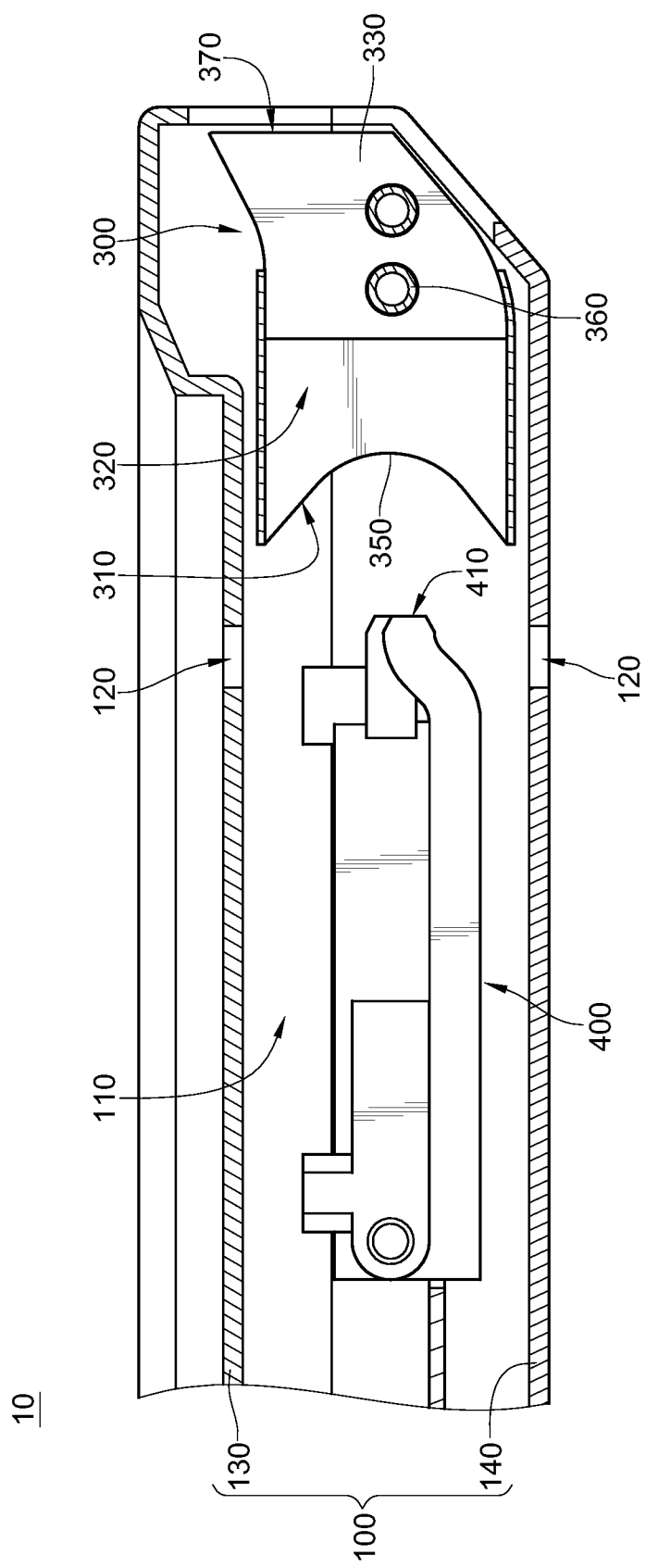
FIG. 8B is a sectional view of the embodiment described in FIG. 8A.

FIG. 8A is a three dimensional composite layout of the ninth embodiment of an electronic device of the present invention and FIG. 8B is a sectional view of the embodiment described in FIG. 8A. The airflow guiding structure 300 in this embodiment includes an air inlet 310, an air outlet 370, a guide hood 320 and a plurality of cooling fins 330 installed in the guide hood 320. The cooling fins 330 stretch from the air inlet 310 toward the air outlet 370 making the airflow guiding structure 300 have two portions, one of which is a flow guiding portion close to the first nozzle 410 and a cooling fin section being away from the first nozzle 410. The cooling fins 330 are either completely surrounded or partially covered by the guide hood 320.

Figure 9:
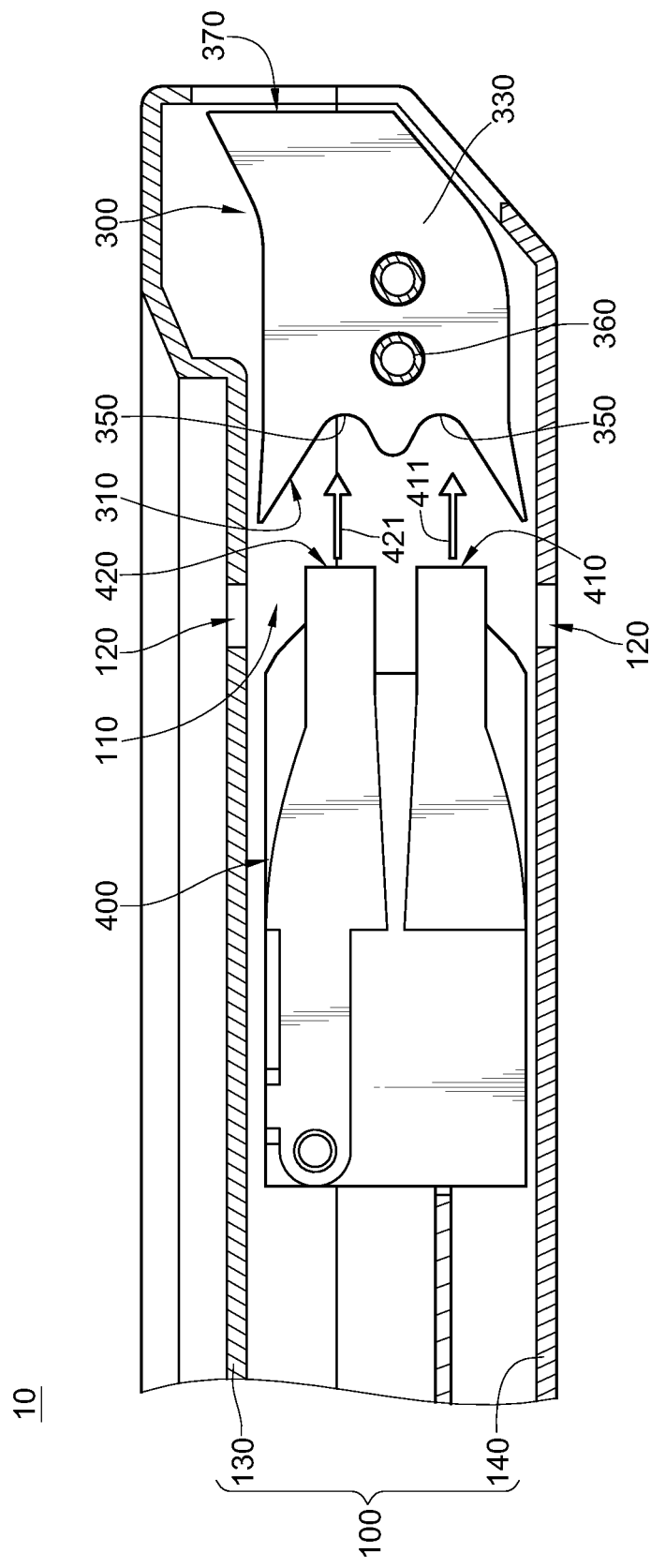
FIG. 9 is a sectional view of the tenth embodiment of an electronic device of the present invention.

FIG. 9 is a sectional view of the tenth embodiment of an electronic device of the present invention. The jet flow generator 400 includes a second nozzle 420 which is directed towards the air inlet 310 of the airflow guiding structure at a distance apart in this embodiment. A second air jet flow 421 emitted from the jet flow generator 400 through the second nozzle 420 travels at a velocity greater than 0.1 m/s, causing a fluid pressure differential with its neighboring air and pulling air in its vicinity along the air inlet 310 into the airflow guiding structure 300. Further, the airflow guiding structure 300 also include one edge surface 340 facing the second nozzle 420. The edge surface 340 described in this embodiment is concave and the edge surface 340 is shaped with two cavities 350, one of which is opposite the first nozzle 410 and the other located opposite second nozzle 420.

According the embodiments of the electronic device of the present invention described above, the air jet flow emitted from the jet flow generator travels at a velocity greater than 0.1 meters/second (m/s), causing a fluid pressure differential with its neighboring air and pulling air in its vicinity along the air inlet into the airflow guiding structure, in order to increase the airflow rate going to the airflow guiding structure as well as the heat dissipation efficiency for the electronic device.

In addition, the airflow blocking plates in the electronic device of the present invention bar the airflow in one direction and force the first air jet flow and its surrounding air to mass into the airflow guiding structure. As a result, both the airflow rate going to the airflow guiding structure and the heat dissipation efficiency of the electronic device increase.

Furthermore, the periphery of a concave edge surface of the airflow guiding structure gathers paths of airflow ejected from every nozzle. When an air jet flow is emitted from the jet flow generator, its neighboring air is led by the curved surface of the airflow guiding structure and flows into the airflow guiding structure.

Since the air inlet structure described in some of the embodiments of the present invention is a through hole, the first air jet flow ejected from the jet flow generator not only draws its neighboring air inside the casing but also brings in cool air via the through holes from outside the casing into the airflow guiding structure. The cool air from outside the casing helps improve the heat exchange process and increases the heat dissipation efficiency for the electronic device.

The foregoing description of the exemplary embodiments of the invention has been presented only for the purposes of illustration and description and is not intended to be exhaustive or to limit the invention to the precise forms disclosed. Many modifications and variations are possible in light of the above disclosures and descriptions.

The embodiments herein were chosen and described in order to explain the principles of the invention and their practical application so as to motivate others skilled in the art to utilize the invention and its various embodiments and to use various modifications as suitable for specific applications. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electronic device, comprising:
a casing including an interior space;
a heat generation source;
an airflow guiding structure being in contact with the heat generation source and including one air inlet; and
a jet flow generator which is disposed within the interior space of the casing together with the heat generation source and the airflow guiding structure, and has a first nozzle facing the air inlet at a distance apart, the jet generator being configured to emit a first air jet flow traveling at a velocity greater than 0.1 meters/second (m/s) and, due to a fluid pressure difference between the first air jet flow and neighboring air near first air jet flow, the neighboring air being pulled into the airflow guiding structure along the air inlet;
wherein the airflow guiding structure comprises a plurality of cooling fins, which stretch from the air inlet toward a direction away from the first nozzle, and an edge surface, located at the air inlet and facing the first nozzle of the jet flow generator, the first nozzle of the jet flow generator includes one first side and one second side in an opposite direction, and a periphery of the edge surface extends from the first side to the second side.

2. The electronic device according to claim 1, wherein the casing includes an air inlet structure for movement of an airflow between the interior space and outside of the casing.

3. The electronic device according to claim 2, wherein the casing comprises a first panel and a second panel between which the airflow guiding structure and the jet flow generator are disposed, and a through hole is formed on the first panel as the air inlet structure.

4. The electronic device according to claim 3, wherein the through hole includes a first edge, close to the jet flow generator, and a second edge away from the jet flow generator, and has a first distance of the first edge of the through hole to the air inlet of the airflow guiding structure to be smaller than a second distance between the second edge of the through hole and the air inlet of the airflow guiding structure.

5. The electronic device according to claim 1, wherein a cross section of the air inlet in the airflow guiding structure is greater than or equal to a cross section of the first nozzle of the jet flow generator.

6. An electronic device, comprising:
a casing including an interior space;
a heat generation source;
an airflow guiding structure being in contact with the heat generation source and including one air inlet, one air outlet and a plurality of cooling fins, which stretch from the air inlet toward the air outlet, and an edge surface, which is located at the air inlet; and
a jet flow generator disposed within the interior space of the casing together with the heat generation source and the airflow guiding structure, the jet flow generator including one first nozzle facing the air inlet and the edge surface and being at a distance apart from the edge surface and a second nozzle directed toward the air inlet of the airflow guiding structure at a distance apart, a cross section of the air inlet being greater than or equal to that of the first nozzle, the jet flow generator being configured to emit a first air jet flow at a velocity greater than 0.1 meters/second (m/s) through the first nozzle, and due to a fluid pressure difference between the first air jet flow and the neighboring air near the first air jet flow, the neighboring air is pulled along the air inlet into the airflow guiding structure;
wherein the jet flow generator is configured to emit a second air jet flow at a velocity greater than 0.1 m/s through the second nozzle for causing a fluid pressure difference between the second air jet and the neighboring air near the second air jet flow, so that the neighboring air is pulled into the airflow guiding structure along the air inlet; and
wherein the edge surface is concave and shaped with two cavities, one of which is opposite the first nozzle and the other one is located opposite to the second nozzle.

7. The electronic device according to claim 6, wherein the casing of the electronic device comprises an air inlet structure for movement of an airflow between the interior space and outside of the casing.

8. The electronic device according to claim 7, wherein the casing comprises a first panel and a second panel, between which the airflow guiding structure and the jet flow generator are disposed, and a through hole is formed on the first panel as the air inlet structure.

9. The electronic device according to claim 8, wherein the through hole comprises a first edge, close to the jet flow generator, and a second edge away from the jet flow generator, and has a first distance between the first edge of the through hole and the air inlet of the airflow guiding structure to be smaller than a second distance between the second edge of the through hole and the air inlet of the airflow guiding structure.

10. The electronic device according to claim 6, wherein the cooling fins of the airflow guiding structure stretch from the air inlet toward a direction away from the first nozzle.

11. An electronic device, comprising:
a casing including an interior space and an air inlet structure;

a heat generation source;

an airflow guiding structure being in contact with the heat generation source and including one air inlet, one air outlet and a plurality of cooling fins, which stretch from the air inlet toward the air outlet, and an edge surface of concave shape, which is located at the air inlet; and a jet flow generator disposed within the interior space of the casing together with the heat generation source and the airflow guiding structure, and the jet flow generator including a first nozzle facing the air inlet at a distance apart from the edge surface and facing the edge surface;

wherein the air inlet structure is for movement of an airflow between the interior space and outside of the casing, the first nozzle having one first side, which is disposed in the same area where the air inlet of the airflow guiding structure is, and one second side in an opposite direction, and a periphery of the edge surface of concave shape extends from the first side to the second side.

12. The electronic device according to claim 11, wherein the casing comprises a first panel and a second panel, between which the airflow guiding structure and the jet flow generator are disposed, the first panel and the second panel extend from the jet flow generator toward the airflow guiding structure, and a through hole is formed on the first panel as the air inlet structure.

13. The electronic device according to claim 12, wherein the through hole includes one first edge, close to the jet flow generator, and one second edge away from the jet flow generator, and has one first distance of the first edge of the through hole to the air inlet of the airflow guiding structure smaller than one second distance between the second edge of the through hole and the air inlet of the airflow guiding structure.

14. The electronic device according to claim 11, wherein a first air jet flow emitted from the jet flow generator through the first nozzle travels at a velocity greater than 0.1 meters/second (m/s), causing a fluid pressure difference between the first air jet flow and neighboring air near the first air jet flow, so that the neighboring air is pulled along the air inlet into the airflow guiding structure.

\* \* \* \* \*